United States Patent
Kusano et al.

(10) Patent No.: US 11,066,627 B2
(45) Date of Patent: Jul. 20, 2021

(54) CLEANING AGENT COMPOSITION FOR SEMICONDUCTOR DEVICE SUBSTRATE, METHOD OF CLEANING SEMICONDUCTOR DEVICE SUBSTRATE, METHOD OF MANUFACTURING SEMICONDUCTOR DEVICE SUBSTRATE, AND SEMICONDUCTOR DEVICE SUBSTRATE

(71) Applicant: Mitsubishi Chemical Corporation, Chiyoda-ku (JP)

(72) Inventors: Tomohiro Kusano, Tokyo (JP); Ken Harada, Tokyo (JP); Yasuhiro Kawase, Tokyo (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 0 days.

(21) Appl. No.: 16/570,682

(22) Filed: Sep. 13, 2019

(65) Prior Publication Data

US 2020/0002652 A1  Jan. 2, 2020

Related U.S. Application Data

(63) Continuation of application No. PCT/JP2018/010323, filed on Mar. 15, 2018.

(30) Foreign Application Priority Data

Mar. 17, 2017 (JP) .............................. JP2017-052098

(51) Int. Cl.
*C11D 3/26* (2006.01)
*C11D 11/00* (2006.01)
*B08B 3/08* (2006.01)
*C11D 7/26* (2006.01)
*C11D 7/32* (2006.01)
*C11D 7/50* (2006.01)
*H01L 21/02* (2006.01)

(52) U.S. Cl.
CPC ............ *C11D 11/0047* (2013.01); *B08B 3/08* (2013.01); *C11D 7/265* (2013.01); *C11D 7/3209* (2013.01); *C11D 7/3218* (2013.01); *C11D 7/5013* (2013.01); *C11D 7/5022* (2013.01); *H01L 21/02068* (2013.01)

(58) Field of Classification Search
CPC .................................................... C11D 11/0047
USPC ......................................................... 510/175
See application file for complete search history.

(56) References Cited

U.S. PATENT DOCUMENTS

| | | | |
|---|---|---|---|
| 2006/0166847 A1 | 7/2006 | Walker et al. | |
| 2010/0056409 A1 | 3/2010 | Walker et al. | |
| 2012/0048295 A1* | 3/2012 | Du | C11D 11/0047 134/3 |
| 2015/0140820 A1 | 5/2015 | Kawada et al. | |
| 2016/0201016 A1* | 7/2016 | Ivanov | C11D 7/32 510/175 |
| 2017/0158992 A1 | 6/2017 | Ivanov et al. | |
| 2019/0079409 A1* | 3/2019 | Takahashi | C11D 7/20 |

FOREIGN PATENT DOCUMENTS

| | | |
|---|---|---|
| JP | 2003-17458 A | 1/2003 |
| JP | 2003-257922 A | 9/2003 |
| JP | 2008-543060 A | 11/2008 |
| JP | 2011-74189 A | 4/2011 |
| WO | WO 2013/162020 A1 | 10/2013 |
| WO | WO 2016/011331 A1 | 1/2016 |

OTHER PUBLICATIONS

International Search Report dated Jun. 12, 2018 in PCT/JP2018/010323 filed Mar. 15, 2018 (with English translation).
Written Opinion dated Jun. 12, 2018 in PCT/JP2018/010323 filed Mar. 15, 2018.

\* cited by examiner

*Primary Examiner* — Gregory E Webb
(74) *Attorney, Agent, or Firm* — Oblon, McClelland, Maier & Neustadt, L.L.P.

(57) ABSTRACT

According to the present invention, there is provided a cleaning agent composition for a semiconductor device substrate including at least one of wiring and an electrode in which the wiring and the electrode contain cobalt or a cobalt alloy, the cleaning agent composition including a component (A): at least one compound selected from the group consisting of specific compounds; and a component (B): water.

17 Claims, No Drawings

CLEANING AGENT COMPOSITION FOR SEMICONDUCTOR DEVICE SUBSTRATE, METHOD OF CLEANING SEMICONDUCTOR DEVICE SUBSTRATE, METHOD OF MANUFACTURING SEMICONDUCTOR DEVICE SUBSTRATE, AND SEMICONDUCTOR DEVICE SUBSTRATE

TECHNICAL FIELD

The present invention relates to a cleaning agent composition for a semiconductor device substrate, a method of cleaning a semiconductor device substrate, a method of manufacturing a semiconductor device substrate, and a semiconductor device substrate, and more specifically, a cleaning agent composition for effectively cleaning a surface of a semiconductor device substrate that includes at least one of wiring and an electrode containing cobalt or a cobalt alloy on a surface, a cleaning method using the cleaning agent composition, a method of manufacturing a semiconductor device substrate, and a semiconductor device substrate.

BACKGROUND ART

The semiconductor device substrate is manufactured in a manner that a deposited layer of a metal film or an interlayer dielectric to be wiring is formed on a silicon wafer substrate, thereafter, a surface thereof is planarized by a chemical mechanical polishing (hereinafter, referred to as "CMP") step using a polishing agent including aqueous slurry containing abrasive fine particles, and a new layer is stacked on the planarized surface. In microfabrication of a semiconductor device substrate, each layer is required to have high-precision flatness and importance of planarization using the CMP increases more and more.

As the layer, there are a wiring layer having wiring which contains copper or a copper alloy and wiring which is formed of barrier metals, and a contact plug layer having a contact plug (an electrode) which connects a transistor and the wiring layer. Each of the wiring layer and the contact plug layer is formed on a substrate in the same step, and is similarly planarized by the CMP step.

A large number of abrasive particles such as colloidal silica used in the CMP step, organic residues derived from a corrosion inhibitor contained in the slurry, or the like are present on the surface of the semiconductor device substrate after the CMP step. Therefore, in order to remove these, the semiconductor device substrate after the CMP step is subjected to a cleaning step.

In the cleaning step after the CMP process, an acidic cleaning agent composition and an alkaline cleaning agent composition are used. In an acidic aqueous solution, colloidal silica is positively charged, a surface of the substrate is negatively charged, an electrical attraction is exerted, and it becomes difficult to remove the colloidal silica. On the contrary, in an alkaline aqueous solution, since $OH^-$ is abundant, both the colloidal silica and the surface of the substrate are negatively charged, electrical repulsion is exerted, and it becomes easy to remove the colloidal silica.

In addition, a trace metal component such as a derivative eluted from the metal is also present as a residue on the surface of the substrate after the CMP step. These residues can be removed by ionization or dissolution with a chelating agent or the like. However, there was a case where the chelating agent corroded or oxidatively deteriorated the metal on the surface of the substrate. The residual component or a mechanism of the corrosion and oxidative deterioration is different between a layer containing usually copper metal like the wiring layer and a layer not containing usually the copper metal like the contact plug layer.

For a layer serving as the contact plug (the electrode) of the related art, tungsten (W) or a tungsten alloy is generally used as metals to be used, and even for the cleaning agent composition to be used after the CMP step of the layer, various cleaning agent compositions are proposed.

For example, PTL 1 discloses a cleaning agent composition including one or more acids selected from the group consisting of carbonic acid, boric acid, and carboxylic acid having a saturated aliphatic group, in which pH is 4 or higher.

In addition, PTL 2 discloses a cleaning agent for a semiconductor substrate, including (A) a phosphonic acid chelating agent, (B) a primary or secondary monoamine having at least one alkyl group or a hydroxyl alkyl group in a molecule, and (C) water, in which pH is higher than 6 and lower than 7.

PTL 3 discloses a cleaning agent composition including (a) an acid and/or a salt thereof having an acid dissociation index $pKa_n$ (25° C.) at n-th step of an n-valent basic acid of 3 or more and 11 or less, (b) water, and (c) a chelating agent containing a nitrogen atom in a molecule, in which pH is 6 or higher and 11 or lower.

On the other hand, in the semiconductor device substrate, miniaturization of the wiring and the electrode (the contact plug) that connects a transistor and a wiring layer is rapidly progressing in order to achieve speedup and high integration of a device. However, when copper, tungsten, or a tungsten alloy conventionally used in fine wiring and electrode is used as a material for the wiring and the electrode, an increase in a resistance value in accordance with the miniaturization becomes a problem. Therefore, in recent years, wiring and an electrode formed of cobalt or a cobalt alloy having a low resistance value have begun to be introduced.

CITATION LIST

Patent Literature

[PTL 1] JP-A-2003-017458
[PTL 2] International Publication No. WO2013/162020
[PTL 3] JP-A-2003-257922

SUMMARY OF INVENTION

Technical Problem

However, when the cobalt or the cobalt alloy is used for the wiring or the electrode of a substrate, the cleaning agent compositions of PTLs 1 to 3 that have been used for the wiring or the electrode of the tungsten so far do not have sufficient cleaning performance. In particular, it was found that corrosion is likely to occur in an area of acid to neutral as described in PTL 2, and oxidation or corrosion of the wiring formed of the cobalt or the cobalt alloy becomes a problem.

In addition, PTL 3 discloses an alkaline cleaning agent composition and also discloses that various chelating agents can be contained. However, it was not considered as a cleaning agent composition having a sufficient function in terms of compatibility between inhibition of corrosion of the cobalt (Co) (=inhibition of Co elution amount) and reduction of residues on the surface of the substrate.

As described above, various cleaning agent compositions have been studied until now for cleaning a substrate having a wiring layer containing copper (Cu) and cleaning a substrate having a contact plug layer containing tungsten. However, at present, cleaning a semiconductor device substrate having wiring or an electrode which was begun to be introduced in recent years and used cobalt or a cobalt alloy has not been sufficiently studied.

Under such circumstances, an object of the present invention is to provide a cleaning agent composition, which is used in a cleaning step for a semiconductor device substrate, in particular, a semiconductor device substrate having at least one of wiring and an electrode containing cobalt or a cobalt alloy, has low corrosion against the wiring and the electrode, and can prevent a residue from attaching to a surface of the substrate in a cleaning step, a method of cleaning a semiconductor device substrate, a method of manufacturing a semiconductor device substrate, and a semiconductor device substrate.

Solution to Problem

The present inventors have intensively studied to solve the problems. As a result, it was found that the following aspects of the invention meet the object, and the present invention was reached.

The present inventors focused on use of a chelating agent, which was exemplified as a component of a cleaning agent composition for Cu wiring so far but was not fully utilized.

In the cleaning agent composition for Cu wiring, since Cu and a corrosion inhibitor form a strong insoluble complex to be a residue, it is necessary to use a strong chelate to remove the residue.

However, as a result of the study of the present inventors, it was found that even a relatively weak chelating agent can sufficiently remove the residue in a case of cobalt. Based on this finding, as a result of further intensive study, it was found that when using a chelating agent having a specific structure, it is possible to exert a sufficient cleaning performance while inhibiting corrosion of cobalt.

That is, gist the present invention relates to the following aspects of the invention.

[1] A cleaning agent composition for a semiconductor device substrate including at least one of wiring and an electrode in which the wiring and the electrode contain cobalt or a cobalt alloy, the cleaning agent composition comprising the following components (A) and (B):

component (A): at least one compound selected from the group consisting of compounds represented by Formulas (1) to (4) below,

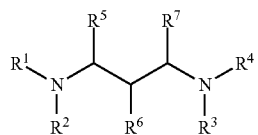

(1)

(in Formula (1), $R^1$ represents an alkyl group having 1 to 4 carbon atoms; and $R^2$ to $R^7$ each independently represent a hydrogen atom, an alkyl group having 1 to 4 carbon atoms, a carboxyl group, a carbonyl group, or a functional group having an ester bond,)

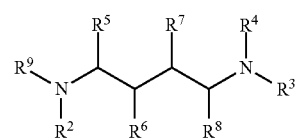

(2)

(in Formula (2), $R^2$ to $R^9$ each independently represent a hydrogen atom, an alkyl group having 1 to 4 carbon atoms, a carboxyl group, a carbonyl group, or a functional group having an ester bond,)

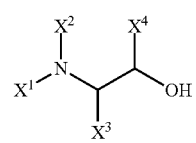

(3)

(in Formula (3), $X^1$ to $X^4$ each independently represent a hydrogen atom, an alkyl group having 1 to 4 carbon atoms, a carboxyl group, a carbonyl group, or a functional group having an ester bond,)

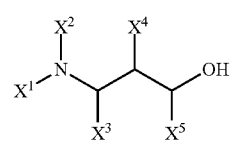

(4)

(in Formula (4), $X^1$ to $X^4$ each independently represent a hydrogen atom, an alkyl group having 1 to 4 carbon atoms, a carboxyl group, a carbonyl group, or a functional group having an ester bond;) and component (B): water.

[2] The cleaning agent composition for a semiconductor device substrate according to item [1], wherein a pH value is 9 to 14.

[3] The cleaning agent composition for a semiconductor device substrate according to item [1] or [2], wherein in Formula (1), $R^1$ is a methyl group, $R^2$ is a methyl group or a hydrogen atom, and $R^3$ to $R^7$ each represent a hydrogen atom.

[4] The cleaning agent composition for a semiconductor device substrate according to any one of items [1] to [3], wherein in Formula (2), $R^2$ to $R^9$ each represent a hydrogen atom.

[5] The cleaning agent composition for a semiconductor device substrate according to any one of items [1] to [4], wherein in Formula (3), $X^1$ to $X^4$ each independently represent a hydrogen atom or an alkyl group having 1 to 4 carbon atoms.

[6] The cleaning agent composition for a semiconductor device substrate according to any one of items [1] to [4], wherein in Formula (3), $X^1$ to $X^3$ each represent a hydrogen atom, and $X^4$ is a methyl group.

[7] The cleaning agent composition for a semiconductor device substrate according to any one of items [1] to [6], wherein in Formula (4), $X^1$ to $X^5$ each represent a hydrogen atom.

[8] The cleaning agent composition for a semiconductor device substrate according to any one of items [1] to [7], wherein a content rate of the component (A) is 0.001% by mass to 0.5% by mass in 100% by mass of a total amount of the cleaning agent composition.

[9] The cleaning agent composition for a semiconductor device substrate according to any one of items [1] to [8], wherein a cobalt elution amount is 200 ppb or less.

[10] The cleaning agent composition for a semiconductor device substrate according to any one of items [1] to [9], further comprising: a pH adjuster as a component (C).

[11] The cleaning agent composition for a semiconductor device substrate according to item [10], wherein the component (C) contains a compound represented by Formula (p1).

$$(R^{a1})_4 N^+ OH^- \tag{p1}$$

(in Formula (p1), $R^{a1}$ represents a hydroxyl group, an alkoxy group, or an alkyl group which may be substituted with halogen, and four $R^{a1}$'s may be the same as or different from each other.)

[12] The cleaning agent composition for a semiconductor device substrate according to any one of items [1] to [11], further comprising: a reducing agent as a component (D).

[13] The cleaning agent composition for a semiconductor device substrate according to any one of items [1] to [12], further comprising: a surfactant as a component (E).

[14] The cleaning agent composition for a semiconductor device substrate according to any one of items [1] to [13], wherein the semiconductor device substrate is a semiconductor device substrate after chemical mechanical polishing.

[15] A method of cleaning a semiconductor device substrate, comprising:
cleaning a semiconductor device substrate by using the cleaning agent composition for a semiconductor device substrate according to any one of items [1] to [14].

[16] A method of manufacturing a semiconductor device substrate, comprising:
a step of cleaning a semiconductor device substrate using the cleaning agent composition for a semiconductor device substrate according to any one of items [1] to [14].

[17] A semiconductor device substrate which is obtained by cleaning a semiconductor device substrate by using the cleaning agent composition for a semiconductor device substrate according to any one of items [1] to [14].

Advantageous Effects of Invention

When using a cleaning agent composition for a semiconductor device substrate of the present invention, corrosion of wiring and an electrode containing cobalt or a cobalt alloy is prevented from occurring in a step of cleaning a semiconductor device substrate, and a residue is prevented from attaching to the substrate in the cleaning step. Accordingly, effective cleaning is performed.

In addition, the cleaning agent composition for a semiconductor device substrate of the present invention is preferably used in the step of cleaning a semiconductor device substrate after a CMP step. In this case, a residue generated in the CMP step is removed to efficiently perform cleaning after the CMP step.

DESCRIPTION OF EMBODIMENTS

Hereinafter, embodiments of the present invention will be specifically described. However, the present invention is not limited to the following embodiments, and can be performed with appropriate modifications within the scope of the gist thereof.

In the present specification, the term "cobalt or a cobalt alloy" may be collectively referred to as a "Co-based material". In addition, wiring containing the cobalt or the cobalt alloy may be referred to as a "Co-based wiring", and an electrode containing the cobalt or the cobalt alloy may be referred to as a "Co-based electrode", in some cases.

[Cleaning agent Composition for Semiconductor Device Substrate]

A cleaning agent composition for a semiconductor device substrate of the present invention (hereinafter, referred to as a "cleaning agent composition of the present invention" in some cases) is a cleaning agent composition for a semiconductor device substrate including at least one of wiring and an electrode which contain cobalt or a cobalt alloy. This is a cleaning agent composition used in cleaning of a semiconductor device substrate, preferably, in a step of cleaning a semiconductor device substrate, which is performed after a chemical mechanical polishing (CMP) step in manufacturing of a semiconductor device, and is used for a semiconductor device substrate in which at least one of a wiring portion or an electrode portion contains cobalt or a cobalt alloy. The cleaning agent composition contains the following components (A) and (B).

Component (A): At Least One Compound Selected from the Group Consisting of Compounds Represented by Formulas (1) to (4) Below

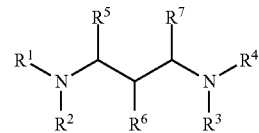

(1)

In Formula (1), $R^1$ represents an alkyl group having 1 to 4 carbon atoms. $R^2$ to $R^7$ each independently represent a hydrogen atom, an alkyl group having 1 to 4 carbon atoms, a carboxyl group, a carbonyl group, or a functional group having an ester bond.

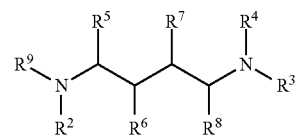

(2)

In Formula (2), $R^2$ to $R^9$ each independently represent a hydrogen atom, an alkyl group having 1 to 4 carbon atoms, a carboxyl group, a carbonyl group, or a functional group having an ester bond.

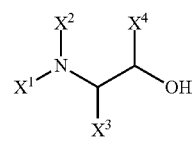

(3)

In Formula (3), $X^1$ to $X^4$ each independently represent a hydrogen atom, an alkyl group having 1 to 4 carbon atoms, a carboxyl group, a carbonyl group, or a functional group having an ester bond.

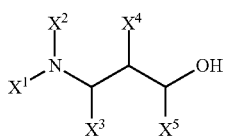

(4)

In Formula (4), $X^1$ to $X^5$ each independently represent a hydrogen atom, an alkyl group having 1 to 4 carbon atoms, a carboxyl group, a carbonyl group, or a functional group having an ester bond.

Component (B): Water

As one of features, the cleaning agent composition of the present invention contains, as the component (A), at least one selected from the group consisting of compounds represented by Formulas (1) to (4).

When containing a nitrogen-containing compound having such a specific structure, it is possible to reduce a residue on a substrate while inhibiting corrosion of the Co-based material. That is, it is possible to achieve compatibility between inhibition of the corrosion of the Co-based material and reduction of the residue on the surface of the substrate.

A detailed mechanism of the component (A) in the cleaning of the semiconductor device substrate is unknown, but it is presumed as follows. On the semiconductor device substrate having at least one of the Co-based wiring and a Co-based electrode, it is considered that an insoluble complex formed from Co and a corrosion inhibitor becomes a residue. Then, it is considered that, in a case of Co, since an ability to form a complex with the corrosion inhibitor is lower than that of Cu, even in a case of a chelate having a relatively weak chelating effect as the component (A), it is possible to remove the insoluble complex of Co and the corrosion inhibitor, and it is possible to exert a sufficient cleaning performance while inhibiting the corrosion of the Co-based material.

In addition, it is preferable that the cleaning agent composition of the present invention is alkaline and has a pH value of 9 to 14.

As described above, in an alkaline aqueous solution, since OH⁻ is abundant, a surface of a particle such as colloidal silica is negatively charged, and the surface of the substrate to be a target of cleaning is also similarly negatively charged. A zeta potential in the solution is controlled to be the same sign. Accordingly, an electrical repulsive force is generated. As a result, it is possible to easily remove the particle from the surface of the substrate, and it is possible to prevent the particles which was once removed from reattaching to the surface of the substrate.

Since it is possible to inhibit the corrosion of Co, the pH value of the cleaning agent composition of the present invention is preferably 9 or higher, and more preferably 10 or higher. In addition, since it is an aqueous solution, an upper limit of the pH value is usually 14 or lower. However, since it is possible to reduce a mixing amount of the pH adjuster and reduce costs, the upper limit of the pH value is more preferably 13 or lower. The pH value at the time of using the cleaning agent composition of the present invention can be adjusted by an addition amount of each component included in the cleaning agent composition.

In the present invention, the pH value is a value measured by a pH meter. Specifically, it will be described later in Examples.

In addition, in the cleaning agent composition of the present invention, a cobalt elution amount is preferably 200 ppb or less, more preferably 150 ppb or less, and still more preferably 100 ppb or less.

Here, the cobalt elution amount in the present invention is determined by the following operation. That is, the semiconductor device substrate having at least one of wiring and an electrode which contain cobalt or a cobalt alloy is cut into a 20 mm square (a substrate after the cutting contains 360 µg or more of cobalt), and this is immersed in 20 mL of the cleaning agent composition of the present invention under a condition of 25° C. for 30 minutes. Thereafter, the substrate after the cutting is taken out, and a cobalt concentration in the cleaning agent composition after the immersion can be measured by an ICP atomic emission spectrometer to determine the cobalt elution amount (ppb).

Hereinafter, the components (A) and (B) will be described in more detail.

<Component (A): At Least One Compound Selected from the Group Consisting of Compounds Represented by Formulas (1) to (4)>

The component (A) contained in the cleaning agent composition of the present invention includes at least one compound selected from the group consisting of compounds represented by Formulas (1) to (4).

The component (A) has a function of dissolving and removing impurity metal contained in the Co-based wiring and the Co-based electrode of the surface of the substrate by a chelating effect.

In addition, in a case of using the cleaning agent composition of the present invention is used in the cleaning step after the CMP step, the component (A) has an function of dissolving and removing the insoluble metal complex of the corrosion inhibitor and Co which are present in the slurry used in the CMP step, by the chelating effect.

As described above, since the compounds represented by Formulas (1) to (4) have a relatively weak chelating effect, it is possible to exert a sufficient cleaning performance while inhibiting the corrosion of Co.

The cleaning agent composition of the present invention may contain at least one compound selected from the group consisting of compounds represented by Formulas (1) to (4), as the component (A). Among them, since it is excellent in an effect of reducing a residue on the surface of the substrate, it is preferable to contain the compound represented by Formula (1) and/or Formula (3) as the component (A), and it is more preferable to contain the compound represented by Formula (1) as the component (A).

In addition, two or more compounds represented by the same Formulas may be contained.

In Formula (1), $R^1$ represents an alkyl group having 1 to 4 carbon atoms. The alkyl group having 1 to 4 carbon atoms as $R^1$ may be linear or branched, and may be unsubstituted or may have a substituent such as halogen. In order to further enhance the effect of achieving the compatibility between reduction of corrosion of Co and reduction of the residue on the surface of the substrate, $R^1$ in Formula (1) is preferably a methyl group.

In Formula (1), $R^2$ to $R^7$ each independently represent a hydrogen atom, an alkyl group having 1 to 4 carbon atoms, a carboxyl group, a carbonyl group, or a functional group having an ester bond. In Formula (1), the alkyl group having 1 to 4 carbon atoms represented by $R^2$ to $R^7$ may be linear or branched, and may be unsubstituted or may have a substituent such as halogen, as in $R^1$.

In addition, in order to further enhance the effect of achieving the compatibility between the reduction of corrosion of Co and the reduction of the residue on the surface of the substrate, in Formula (1), $R^2$ to $R^7$ each independently are preferably a hydrogen atom or an alkyl group having 1 to 4 carbon atoms.

As will be described in more detail, in order to further enhance the effect of achieving the compatibility between the reduction of corrosion of Co and the reduction of the residue on the surface of the substrate, in Formula (1), $R^2$ is preferably a hydrogen atom or an alkyl group having 1 to 4 carbon atoms, $R^2$ is more preferably a hydrogen atom or a methyl group, and $R^2$ is particularly preferably a methyl group.

In Formula (1), $R^3$ to $R^7$ each independently are preferably a hydrogen atom or an alkyl group having 1 to 4 carbon atoms, and more preferably a hydrogen atom. In order to further enhance the effect of achieving the compatibility between the reduction of corrosion of Co and the reduction of the residue on the surface of the substrate, in Formula (1), all of $R^3$ to $R^7$ are preferably a hydrogen atom.

Among the compounds represented by Formula (1), a compound in which in Formula (1), $R^1$ is a methyl group, $R^2$ is a hydrogen atom or a methyl group, and $R^3$ to $R^7$ each are a hydrogen atom is particularly preferable.

Specific examples of the compound represented by Formula (1) include N,N-dimethyl-1,3-diaminopropane, N-methyl-1,3-diaminopropane, N,N'-dimethyl-1,3-diaminopropane, N-ethyl-1,3-diaminopropane, and N-ethyl-N-methyl-1,3-diaminopropane. Among the compounds represented by Formula (1), since it is possible to enhance the effect of achieving compatibility between the reduction of corrosion of Co and the reduction of the residue on the surface of the substrate, the N,N-dimethyl-1,3-diaminopropane, the N-methyl-1,3-diaminopropane, the N,N'-dimethyl-1,3-diaminopropane, and the N-ethyl-1,3-diaminopropane are preferable, the N,N-dimethyl-1,3-diaminopropane and the N-methyl-1,3-diaminopropane are more preferable, and the N,N-dimethyl-1,3-diaminopropane is particularly preferable.

In Formula (2), $R^2$ to $R^9$ each independently represent a hydrogen atom, an alkyl group having 1 to 4 carbon atoms, a carboxyl group, a carbonyl group, or a functional group having an ester bond. In Formula (2), the alkyl group having 1 to 4 carbon atoms represented by $R^2$ to $R^1$ may be linear or branched, and may be unsubstituted or may have a substituent such as halogen, as in $R^1$.

In addition, in order to further enhance the effect of achieving the compatibility between the reduction of corrosion of Co and the reduction of the residue on the surface of the substrate, in Formula (2), $R^2$ to $R^9$ each independently are preferably a hydrogen atom or an alkyl group having 1 to 4 carbon atoms and each independently are more preferably a hydrogen atom or a methyl group, and all of $R^2$ to $R^9$ are particularly preferably a hydrogen atom.

Specific examples of the compound represented by Formula (2) include 1,4-diaminobutane, N-methyl-1,4-diaminobutane, N,N'-dimethyl-1,4-diaminobutane, and N-ethyl-1,4-diaminobutane. Among the compounds represented by Formula (2), since it is possible to enhance the effect of achieving compatibility between the reduction of corrosion of Co and the reduction of the residue on the surface of the substrate, the 1,4-diaminobutane, the N-methyl-1,4-diaminobutane, and N,N'-dimethyl-1,4-diaminobutane are preferable and the 1,4-diaminobutane is more preferable.

$X^1$ to $X^4$ in Formula (3) or $X^1$ to $X^5$ in Formula (4) each independently represent a hydrogen atom, an alkyl group having 1 to 4 carbon atoms, a carboxyl group, a carbonyl group, or a functional group having an ester bond, and the alkyl group having 1 to 4 carbon atoms may be linear or branched, and may be unsubstituted or may have a substituent such as halogen.

In addition, in order to further enhance the effect of achieving the compatibility between the reduction of corrosion of Co and the reduction of the residue on the surface of the substrate, $X^1$ to $X^4$ in Formula (3) or $X^1$ to $X^5$ in Formula (4) each independently are preferably a hydrogen atom or an alkyl group having 1 to 4 carbon atoms and each independently are more preferably a hydrogen atom or a methyl group.

As will be described in more detail, in order to further enhance the effect of achieving the compatibility between the reduction of corrosion of Co and the reduction of the residue on the surface of the substrate, in Formula (3), $X^1$ to $X^3$ each independently are preferably a hydrogen atom or an alkyl group having 1 to 4 carbon atoms, and all of $X^1$ to $X^3$ are particularly preferably a hydrogen atom.

In addition, in order to further enhance the effect of achieving the compatibility between the reduction of corrosion of Co and the reduction of the residue on the surface of the substrate, in Formula (3), $X^4$ is preferably a hydrogen atom or an alkyl group having 1 to 4 carbon atoms, more preferably an alkyl group having 1 to 4 carbon atoms, and still more preferably a methyl group.

In addition, in order to further enhance the effect of achieving the compatibility between the reduction of corrosion of Co and the reduction of the residue on the surface of the substrate, in Formula (4), $X^1$ to $X^5$ each independently are preferably a hydrogen atom or an alkyl group having 1 to 4 carbon atoms, and preferably a hydrogen atom.

Specific examples of the compound represented by Formula (3) include DL-1-amino-2-propanol, DL-1-amino-2-butanol, 2-amino-3-butanol, and 3-amino-4-pentanol. Among the compounds represented by Formula (3), since it is possible to enhance the effect of achieving compatibility between the reduction of corrosion of Co and the reduction of the residue on the surface of the substrate, the DL-1-amino-2-propanol, the DL-1-amino-2-butanol, and the 2-amino-3-butanol are preferable and the DL-1-amino-2-propanol is more preferable.

Specific examples of the compound represented by Formula (4) include 3-amino-1-propanol, 3-amino-2-methyl-1-propanol, 3-amino-1-butanol, and 4-amino-2-butanol. Among the compounds represented by Formula (4), since it is possible to enhance the effect of achieving compatibility between the reduction of corrosion of Co and the reduction of the residue on the surface of the substrate, the 3-amino-1-propanol, the 3-amino-2-methyl-1-propanol, and the 3-amino-1-butanol are preferable and the 3-amino-1-propanol is more preferable.

<Component (B): Water>

Water as the component (B) used in the cleaning agent composition of the present invention mainly functions as a solvent, and it is preferable to use deionized water or ultrapure water in which an impurity is reduced as much as possible.

In addition, the cleaning agent composition of the present invention may contain another additive such as a pH adjuster, a reducing agent, or a surfactant, within a range not impairing an object of the present invention.

<Component (C): pH Adjuster>

The cleaning agent composition of the present invention may further contain a pH adjuster as a component (C), in addition to the components (A) and (B).

In the cleaning agent composition of the present invention, the pH adjuster as the component (C) is not particularly limited as long as it is a component capable of adjusting a pH to be a target pH, and it is possible to use an acid compound or an alkali compound.

Preferable examples of the acid compound include an inorganic acid such as sulfuric acid and nitric acid and a salt thereof, or an organic acid such as acetic acid and lactic acid and a salt thereof.

In addition, as the alkali compound, an organic alkali compound and an inorganic alkali compound can be used. Preferable examples of the organic alkali compound include a quaternary ammonium such as an organic quaternary ammonium hydroxide shown below and a derivative salt thereof, an alkylamine such as trimethylamine and triethylamine and a derivative salt thereof, and an alkanolamine such as a monoethanolamine and a derivative salt thereof.

In the cleaning agent composition of the present invention, preferable examples of the pH adjuster to be used include an inorganic alkali compound containing alkali metal and/or alkaline earth metal, one containing an organic quaternary ammonium hydroxide represented by Formula (p1) below, one containing an alkanolamine represented by Formula (p2), or one containing an organic acid represented by Formula (p3).

$$(R^{a1})_4 N^+ OH^- \quad (p1)$$

Here, in Formula (p1), $R^1$ represents a hydroxyl group, an alkoxy group, or an alkyl group which may be substituted with halogen, and four $R^{a1}$'s may be the same as or different from each other.

$$NH_2-(CH_2)_{n1}-OH \quad (p2)$$

Here, in Formula (p2), n1 is an integer of 2 to 6.

$$R^{a2}-COOH \quad (p3)$$

Here, in Formula (p3), $R^{a2}$ represents a hydroxyl group, an alkoxy group, or an alkyl group which may be substituted with halogen.

In the above Formula (p1), $R^{a1}$ is preferably a hydroxyl group, an alkoxy group having 1 to 4 carbon atoms, or a linear or branched alkyl group having 1 to 4 carbon atoms which may be substituted with halogen, and particularly preferably a linear alkyl group having 1 to 4 carbon atoms and/or a linear hydroxyalkyl group having 1 to 4 carbon atoms. Examples of the alkyl group as $R^{a1}$ include a lower alkyl group having 1 to 4 carbon atoms such as a methyl group, an ethyl group, a propyl group, and a butyl group. Examples of the hydroxyalkyl group include a lower hydroxyalkyl group having 1 to 4 carbon atoms such as a hydroxymethyl group, a hydroxyethyl group, a hydroxypropyl group, and a hydroxybutyl group.

Specific examples of the organic quaternary ammonium hydroxide include tetramethyl ammonium hydroxide (abbreviated as "TMAH", in some cases), bis(2-hydroxyethyl)dimethylammonium hydroxide, tetraethylammonium hydroxide (abbreviated as "TEAH", in some cases), tetrapropyl ammonium hydroxide, tetrabutyl ammonium hydroxide, trimethyl(hydroxyethyl)ammonium hydroxide (common name: choline), and triethyl(hydroxyethyl)ammonium hydroxide.

Among the organic quaternary ammonium hydroxides described above, for reasons such as a cleaning performance, less metal residue, economy, and stability of the cleaning agent composition, the bis(2-hydroxyethyl)dimethylammonium hydroxide, the trimethyl(hydroxyethyl)ammonium hydroxide, the tetramethyl ammonium hydroxide, the tetraethyl ammonium hydroxide, and the tetrabutyl ammonium hydroxide are particularly preferable.

One kind of these organic quaternary ammonium hydroxides may be used alone and two or more kinds thereof may be used in combination at a predetermined ratio.

In Formula (p2), it is preferable that n1 is 2 to 4, from a viewpoint of water solubility.

In Formula (p3), it is preferable that $R^{a2}$ is a methyl group, from the viewpoint of water solubility.

One of these pH adjusters may be used alone, or two or more thereof may be used in combination at a predetermined ratio, and it is preferable that the pH adjuster contains at least the organic quaternary ammonium hydroxide represented by Formula (p1), from viewpoints of pH adjusting power, residual metal ions, and corrosion against Co.

<Component (D): Reducing Agent>

The cleaning agent composition of the present invention may further contain a reducing agent as a component (D), in addition to the components (A) and (B). The reducing agent is expected to suppress oxidation of the Co material and to reduce a corrosion rate of the Co material.

The reducing agent is not particularly limited, and examples of the reducing agent which can be used suitably include ascorbic acid (vitamin C), a gallic acid, and an oxalic acid.

One of these reducing agents may be used alone, and two or more thereof may be used in combination at a predetermined ratio. From the viewpoints of reducing power and safety, ascorbic acid and gallic acid are preferable, and ascorbic acid is more preferable.

<Component (E): Surfactant>

The cleaning agent composition of the present invention may further contain a surfactant as a component (E), in addition to the components (A) and (B). Since a surface of an interlayer dielectric is hydrophobic, it may be difficult to clean with a cleaning agent composition having water as a base composition. The surfactant has a function of improving hydrophilicity of the hydrophobic surface of the substrate. When the surfactant is mixed to improve affinity to the surface of the substrate, it is possible to exert a function of the cleaning agent composition also on a particle or the like present on the substrate, which can contribute to the removal of the residue.

The surfactant is not particularly limited, and any of an anionic surfactant, a cationic surfactant, a nonionic surfactant, and an amphoteric surfactant can be used.

Examples of the surfactant which can be suitably used in the cleaning agent composition of the present invention include the anionic surfactant. Examples of the anionic surfactant include alkyl sulfonic acid and a salt thereof, alkyl benzene sulfonic acid and a salt thereof, alkyl diphenyl ether disulfonic acid and a salt thereof, alkyl methyl taurate and a salt thereof, and sulfosuccinic acid diester and a salt thereof, and particularly preferable examples of sulfonic acid type anionic surfactant include dodecylbenzene sulfonic acid (abbreviated as "DBS", in some cases) and dodecanesulfonic acid and an alkali metal salt thereof.

Among these, from the viewpoint of stability in quality and availability, the dodecylbenzene sulfonic acid and the alkali metal salt thereof are suitably used.

In a case of using the DBS or the alkali metal salt thereof as the component (E), a concentration of the DBS or the alkali metal salt thereof in the cleaning agent composition is preferably less than $2.5 \times 10^{-2}$% by mass is preferable, and still more preferably less than $1.25 \times 10^{-2}$% by mass. When the concentration of the DBS or the alkali metal salt thereof is within the range, deterioration of detergency is suppressed, and foaming and white turbidity hardly occur.

Another example of the anionic surfactant includes a carboxylic acid type anionic surfactant. The carboxylic acid type anionic surfactant is an anionic surfactant containing a carboxyl group in a molecule, and among them, a compound represented by Formula (s1) is preferable.

$$R^b\text{-O-}(AO)_{m1}\text{-}(CH_2)_{m2}\text{-COOH} \qquad (s1)$$

In Formula (s1), $R^b$ is a linear or branched alkyl group, and a carbon number thereof is 8 to 15 and preferably 10 to 13. In addition, AO is an oxyethylene group and/or an oxypropylene group, and m1 is 3 to 30, preferably 4 to 20, and more preferably 4 to 10. In addition, m2 is 1 to 6, and preferably 1 to 3.

Specific examples of the carboxylic acid type anionic surfactant represented by Formula (s1) can include polyoxyethylene lauryl ether acetic acid, polyoxyethylene tridecyl ether acetic acid, and polyoxyethylene alkyl ether acetic acid. One kind of these surfactants such as the anion surfactant may be used alone and two or more kinds thereof may be used in combination at a predetermined ratio.

The surfactant may contain metal impurity of Na, K, Fe, or the like of approximately 1 to several thousands mass ppm in a form marketed normally in some cases. In this case, the surfactant can become a metal contamination source. Therefore, in a case where the component (E) contains the metal impurity, it is preferable that the component (E) is purified and used such that a content of each metal impurity is usually 10 ppm or less, preferably 1 ppm or less, and still more preferably 0.3 ppm or less. As a method for the purification, for example, a method in which the component (E) is dissolved in water and then passed through an ion exchange resin to capture metal impurities in the resin is preferable. When using the surfactant purified in this manner, it is possible to obtain a cleaning agent composition in which a content of the metal impurity is extremely reduced.

<Other Components>

The cleaning agent composition of the present invention may contain the components (A) and (B) described above and appropriately a component other than the components (C) to (E), within a range not impairing the performance.

Examples of the other components include the followings:

a corrosion inhibitor such as a nitrogen-containing organic compound such as urea and thiourea; a water-soluble polymer such as polyethylene glycol and polyvinyl alcohol; and an alkyl alcohol compound such as $R^cOH$ ($R^c$ is an alkyl group having 1 to 4 carbon atoms,)

a dissolved gas such as hydrogen, argon, nitrogen, carbon dioxide, and ammonia, an etching accelerator that can be expected to have the effect of removing a polymer firmly attached after dry etching, such as hydrofluoric acid, ammonium fluoride, and buffered hydrofluoric acid (BHF); and an oxidizing agent such as hydrogen peroxide, ozone, and oxygen In addition, a component other than water, such as ethanol may be contained as a solvent.

<Method of Manufacturing Cleaning Agent Composition>

A method of manufacturing the cleaning agent composition of the present invention is not particularly limited, and may be a conventionally known method. For example, it can be manufactured by mixing constituent components of the cleaning agent composition. Usually, it is manufactured by mixing the component (A) and other components (C), (D), and (E) and the like which are used as needed with the water as the component (B) which is a solvent.

In this case, any order of the mixing may be used as long as there is no particular problem such as occurrence of reaction or precipitation, and among the constituent compositions of the cleaning agent composition, any two or more components are mixed in advance and remaining components thereafter may be mixed. Also, the components may be mixed at once.

A concentration of each component in the cleaning agent composition of the present invention is appropriately determined according to the semiconductor device substrate to be a target of cleaning.

The concentration of the component (A) of the cleaning agent composition of the present invention is generally 0.001% to 20% by mass, preferably 0.001% to 0.5% by mass, still more preferably 0.005% to 0.3% by mass, and particularly preferably 0.01% to 0.2% by mass, in 100% by mass of the total amount of the cleaning agent composition.

When the concentration of the component (A) is 0.001% by mass or more, contamination of the semiconductor device substrate is sufficiently removed. When the concentration of the component (A) is 20% by mass or less, a defect such as corrosion of the Co-based wiring or the Co-based electrode hardly occurs.

The amount of the component (B) of the cleaning agent composition of the present invention usually is required to be the amount of the remainder of the components other than the component (B).

The concentration of the component (C) of the cleaning agent composition of the present invention is preferably 0% to 40% by mass, more preferably 0.001% to 1% by mass, and particularly preferably 0.01% to 0.5% by mass, in 100% by mass of the total amount of the cleaning agent composition, as long as the amount is adjusted to have a desired pH.

The concentration of the component (D) of the cleaning agent composition of the present invention is preferably 0% to 10% by mass, more preferably 0.0001% to 0.15% by mass, and particularly preferably 0.001% to 0.075% by mass, in 100% by mass of the total amount of the cleaning agent composition, from the viewpoint of detergency and corrosion inhibition.

The concentration of the component (E) of the cleaning agent composition of the present invention is preferably 0% to 2% by mass, more preferably 0.0001% to 0.05% by mass, and particularly preferably 0.001% to 0.015% by mass, in 100% by mass of the total amount of the cleaning agent composition, from the viewpoint of detergency and foaming.

A mass ratio between the component (A) and the component (C) (Mass of component (C)/Mass of component (A)) is preferably 0 to 10, more preferably 0.01 to 5, and particularly preferably 0.1 to 3, from viewpoints of removability of contamination of the semiconductor device substrate and inhibition of corrosion of the Co-based wiring or the Co-based electrode.

A mass ratio between the component (A) and the component (D) (Mass of component (D)/Mass of component (A)) is preferably 0 to 8, more preferably 0.001 to 4, and particularly preferably 0.01 to 2, from the viewpoints of removability of contamination of the semiconductor device substrate and inhibition of corrosion of the Co-based wiring or the Co-based electrode.

A mass ratio between the component (A) and the component (E) (Mass of component (E)/Mass of component (A)) is preferably 0 to 8, more preferably 0.001 to 4, and particularly preferably 0.01 to 2, from viewpoints of removability of contamination of the semiconductor device substrate and inhibition of corrosion of the Co-based wiring or the Co-based electrode.

The cleaning agent composition of the present invention can be manufactured by adjusting the concentration of each component to a concentration suitable for cleaning. From viewpoints of reducing costs at the time of transportation and storage, it is often used by diluting with water after manufacturing a cleaning agent composition that contains the respective components at a high concentration (hereinafter, referred to as "cleaning stock solution").

The concentration of each component in the cleaning stock solution is not particularly limited, and is preferably in a range of concentration in which the components (A) and (B), other components added as needed, and reactants thereof do not separate or precipitate in the cleaning stock solution. Specifically, in a preferable concentration range of the cleaning stock solution, the concentration of the component (A) is 0.1% to 15% by mass in the 100% by mass of the total amount of the cleaning stock solution. Within this concentration range, it is possible to suppress separation of the contained component at the time of transportation and storage, and when adding the water as the component (B), it can be easily suitably used as a cleaning agent composition of which concentration is suitable for cleaning.

As described above, the cleaning agent composition to be used in cleaning may be manufactured by diluting the cleaning stock solution such that the concentration of each component is appropriate for the semiconductor device substrate to be a target of cleaning, or each component may be directly adjusted and manufactured so as to satisfy the concentration.

[Method of Cleaning Semiconductor Device Substrate]

Then, a method of cleaning a semiconductor device substrate of the present invention (hereinafter, may be referred to as a "cleaning method of the present invention", in some cases) will be described.

The cleaning method of the present invention is performed by a method of directly contacting the cleaning agent composition of the present invention described above with the semiconductor device substrate. Examples of the semiconductor device substrate to be a target of cleaning include various semiconductor device substrates such as a semiconductor, glass, metal, ceramics, resin, a magnetic material, and a superconductor.

It is possible to perform effective cleaning with the cleaning agent composition of the present invention without causing corrosion to the Co-based wiring and the Co-based electrode. Therefore, among the various semiconductor device substrates, it is suitable as the cleaning agent composition particularly for a semiconductor device substrate having at least one of the Co-based wiring and the Co-based electrode on a surface (that is, cobalt (Co) metal is exposed on the surface).

That is, the cleaning using the cleaning agent composition of the present invention is suitably used in cleaning of the semiconductor device substrate having at least one of the Co-based wiring and the Co-based electrode.

A more preferable target of cleaning is a semiconductor device substrate having the Co-based electrode, which has a function of electrically connecting a transistor and a wiring layer, on a surface of the substrate. That is, it is a semiconductor device substrate having a contact plug layer having the Co-based electrode, on the surface of the substrate.

In addition, the Co-based wiring and the Co-based electrode may contain cobalt or a cobalt alloy, and is preferably formed of cobalt or a cobalt alloy.

The wiring and the electrode formed of cobalt or a cobalt alloy may contain an impurity, within a range of not affecting the performance of the semiconductor device.

In addition, since the cleaning method of the present invention has high cleaning performance even for a hydrophobic low dielectric constant insulating material, it is suitable for a semiconductor device substrate having the low dielectric constant insulating material.

Examples of the low dielectric constant insulating material include an organic polymer material such as polyimide, benzocyclobutene (BCB), Flare (manufactured by Honeywell), SiLK (manufactured by Dow Chemical), inorganic polymer materials such as fluorinated silicate glass (FSG), a SiOC-based material such as BLACK DIAMOND (manufactured by Applied Materials) and Aurora (manufactured by ASM Japan).

Here, the cleaning method of the present invention is particularly suitably applied to a case where the semiconductor device substrate includes at least one of the Co-based wiring and the Co-based electrode, on the surface of the substrate, and the substrate after CMP step is cleaned.

In the CMP step, polishing is performed by rubbing the substrate against the pad using a polishing agent. The polishing agent includes abrasive particles such as colloidal silica ($SiO_2$), fumed silica ($SiO_2$), and alumina ($Al_2O_3$), and ceria ($CeO_2$). Although the abrasive particles are the main cause of contamination of semiconductor device substrate due to fine particles, since the cleaning agent composition of the present invention has functions of removing the fine particles attached to the substrate to disperse in the cleaning agent composition and preventing the fine particles from reattaching, a high effect on the removal of contamination due to the fine particles is exhibited.

In addition, the polishing agent may contain an additive other than the polishing agent, such as an oxidizing agent and a dispersing agent. In particular, in polishing of the CMP of the semiconductor device substrate having at least one of the Co-based wiring and the Co-based electrode on the surface thereof, since the Co-based wiring and the Co-based electrode are likely to be corroded, it is often that a corrosion inhibitor is added.

As the corrosion inhibitor, an azole corrosion inhibitor having a high corrosion inhibitor effect is preferably used. More specifically, examples of the corrosion inhibitor containing a heterocycle in which a hetero atom is only a nitrogen atom include diazoles, triazoles, and tetrazoles. Examples of the corrosion inhibitor containing a heterocycle of a nitrogen atom and an oxygen atom include oxazoles and iso-oxazoles, and oxadiazoles. Examples of the corrosion inhibitor containing a hetrocycle of a nitrogen atom and a sulfur atom include thiazoles, isothiazoles, and thiadiazoles. Among these, particularly a benzotriazole (BTA) corrosion inhibitor having excellent anticorrosion effect is preferably used.

The cleaning agent composition of the present invention is excellent in that the contamination derived from these corrosion inhibitors can be removed extremely effectively when applied to the surface of the substrate after being polished with a polishing agent containing these corrosion inhibitors. That is, when these corrosion inhibitors are present in the polishing agent, the corrosion of a surface of a Co film is inhibited, whereas, the corrosion inhibitors react with Co ions eluted at the time of polishing to generate a large number of insoluble precipitates. The cleaning agent composition of the present invention can efficiently dissolve and remove such insoluble precipitates and can improve yield.

Therefore, the cleaning method of the present invention is suitable for cleaning of the semiconductor device substrate after a surface on which at least one of the Co-based wiring and the Co-based electrode is present is subjected to CMP treatment, and particularly suitable for cleaning of the substrate subjected to the CMP treatment with an polishing agent containing an azole corrosion inhibitor.

The cleaning method of the present invention as described above is performed by a method of directly contacting the cleaning agent composition of the present invention with the semiconductor device substrate. According to a type of the semiconductor device substrate to be a target of cleaning, a cleaning agent composition having a suitable concentration of each component is selected.

In the cleaning method of the present invention, examples of a method of contacting the cleaning agent composition with the substrate include a dip method in which the substrate is immersed in a cleaning tank filled with the cleaning agent composition, a spin method in which the substrate is rotated at high speed while flowing the cleaning agent composition over the substrate from nozzles, and a spray method in which a liquid is sprayed onto the substrate to perform cleaning. Examples of a device for performing this cleaning include a batch type cleaning device which cleans a plurality of substrates contained in a cassette at the same time, and a sheet type cleaning device in which one substrate is mounted on a holder to perform cleaning.

For the cleaning method of the present invention, any of the contact methods can be applied, and from a viewpoint that contamination can be removed more efficiently in a short time, it is preferably in cleaning of the spin method or the spray method. In this case, if it is applied to the sheet type cleaning device which is desired to shorten cleaning time and to reduce the amount of cleaning agent composition to be used, these problems are solved, which is preferable.

In addition, when the cleaning method of the present invention is used with a cleaning method using a physical force, in particular, scrub cleaning using a cleaning brush or ultrasonic cleaning at frequency of 0.5 MHz or higher in combination, removability of the contamination due to the fine particles attached to the substrate is further improved and it also leads to shortening of the cleaning time, which are preferable. In particular, in cleaning after the CMP, it is preferable that the scrub cleaning is performed using a resin brush. Any material of the resin brush may be selected, and for example, it is preferable to use polyvinyl alcohol (PVA) or polyvinyl formal (PVF) which is a modified product thereof.

Further, cleaning with water may be performed before and/or after the cleaning performed by the cleaning method of the present invention. In the cleaning method of the present invention, a temperature of the cleaning agent composition may be usually a room temperature, and may be heated to approximately 30° C. to 70° C., within a range not impairing the performance.

EXAMPLES

Hereinafter, the present invention will be described in more detail using Examples, but the present invention is not limited to the following Examples, as long as it does not change the gist.

Reagents used for manufacturing of the cleaning agent composition of Examples and Comparative Examples are as follows.

[Component (A)]
N,N-Dimethyl-1,3-diaminopropane (manufactured by Tokyo Chemical Industry Co., Ltd.)
DL-1-amino-2-propanol (manufactured by Tokyo Chemical Industry Co., Ltd.)
N-Methyl-1,3-diaminopropane (manufactured by Tokyo Chemical Industry Co., Ltd.)
1,4-Diaminobutane (manufactured by Tokyo Chemical Industry Co., Ltd.)
3-Amino-1-propanol (manufactured by Tokyo Chemical Industry Co., Ltd.)
[Component (B)]
Water
[Component (C): pH Adjuster]
Tetraethyl ammonium hydroxide (TEAH, manufactured by Tokyo Chemical Industry Co., Ltd.)
Acetic acid (manufactured by Tokyo Chemical Industry Co., Ltd.)
[Component (D): Reducing Agent]
Ascorbic acid (manufactured by Tokyo Chemical Industry Co., Ltd.)
[Other Components]
1,3-Diaminopropane (manufactured by Tokyo Chemical Industry Co., Ltd.)
Histidine (manufactured by Tokyo Chemical Industry Co., Ltd.)
Citric acid (manufactured by Tokyo Chemical Industry Co., Ltd.)
1,2,4-Triazole (manufactured by Tokyo Chemical Industry Co., Ltd.)
3,5-Dimethylpyrazole (manufactured by Tokyo Chemical Industry Co., Ltd.)

Examples 1 to 9 and Comparative Examples 1 to 6

<Preparing of Cleaning Agent Composition>

Each component was mixed with water (component (B)) so as to have a composition shown in Table 1 to prepare a cleaning agent composition of Examples 1 to 9 and Comparative Examples 1 to 6. The concentration of the component (B) was a residual concentration excluding the components (A), (C), and (D) and other components.

The prepared cleaning agent composition was used for the following evaluation.

Comparative Example 1 is a comparative example in which only water (component (B)) was used as the cleaning agent composition. Comparative Examples 2 to 6 are comparative examples in which, instead of the component (A), as a compound having a chelating effect, 1,3-diaminopropane, histidine, citric acid, 1,2,4-triazole, and 3,5-dimethyl pyrazole were used.

<pH Measurement>

While stirring the cleaning agent composition of Example 1 using a magnetic stirrer, the pH was measured with a pH meter (trade name "D-24" manufactured by Horiba, Ltd.). The measurement sample was kept at a liquid temperature of 25° C. in a thermostat bath.

Each cleaning agent composition of Examples 2 to 9 and Comparative Examples 1 to 6 were also measured by the same method. Measurement results are shown in Table 1.

<Measurement of Co Elution Amount (Evaluation of Co Corrosion)>

A silicon substrate on which a Co film was formed was cut into 20 mm square. The silicon substrate after the cutting contained 360 μg or more of cobalt. Subsequently, the substrate was immersed in 20 mL of the cleaning agent composition of Example 1, under a condition of 25° C. for 30 minutes. Thereafter, the substrate was taken out, and a Co concentration in the cleaning agent composition after the immersion was measured by an ICP atomic emission spectrometer (model "SPS1700 HVR" manufactured by Seiko Instruments Inc.). An Co elution amount (ppb) eluted for 30 minutes was determined from the determined Co concentration.

A degree of corrosion was evaluated based on the evaluation result of the Co elution amount. When the Co elution amount was 200 (ppb) or less, Co corrosion was regarded as A. In addition, when the Co elution amount exceeds 200 (ppb), the Co corrosion was regarded as B.

Also in the cleaning agent compositions of Examples 2 to 9 and Comparative Examples 1 to 6, the Co elution amount was measured by the same method and the Co corrosion was evaluated. Results were shown in Table 1.

<Evaluation of Cleaning Characteristics>

The silicon substrate on which the Co film was formed and the silicon substrate on which a Cu film was formed were polished with CMP slurry. Thereafter, cleaning was performed using the cleaning agent composition of Example 1 and a PVA brush. After the cleaning, residual foreign matter on the substrate was inspected by a defect inspection tool (Model "LS6600" manufactured by Hitachi High-Technologies Corporation), and the number of defects per 1 $cm^2$ on the silicon substrate on which the Co film was formed and the silicon substrate on which the Cu film was formed was determined.

The cleaning agent compositions of Examples 2 to 9 and Comparative Examples 1 to 6 were also cleaned in the same manner, and the residual foreign matter on the substrate after the cleaning was inspected and the number of defects per 1 $cm^2$ on the silicon substrate on which the Co film was formed and the silicon substrate on which the Cu film was formed was determined.

The cleaning characteristics were evaluated from a relative value based on the number of defects per 1 $cm^2$ on the silicon substrate after the cleaning by using the cleaning agent composition of Comparative Example 1 and the PVA brush.

When the number of defects per 1 $cm^2$ on the surface of the silicon substrate on which the Co film was formed is 70% or less of Comparative Example 1, Co cleaning is regarded as A, and when it exceeds 70%, the Co cleaning was regarded as B. Results were shown in Table 1.

When the number of defects per 1 $cm^2$ on the surface of the silicon substrate on which the Cu film was formed is 70% or less of Comparative Example 1, the Cu cleaning was regarded as A, and when it exceeds 70%, the Cu cleaning was regarded as B. Results were shown in Table 1.

In the following Table 1, "%" means "% by mass", and "DAP" means "diaminopropane".

TABLE 1

| | Component (A) | | Component (B) | Component (C) | | Component (D) | |
|---|---|---|---|---|---|---|---|
| | Component name | Concentration | Component name | Component name | Concentration | Component name | Concentration |
| Example 1 | N,N-dimethyl-1,3-DAP | 0.06% | Water | TEAH | 0.15% | — | — |
| Example 2 | N,N-dimethyl-1,3-DAP | 0.06% | Water | TEAH | 0.15% | ascorbic acid | 0.06% |
| Example 3 | N,N-dimethyl-1,3-DAP | 0.12% | Water | TEAH | 0.04% | — | — |
| Example 4 | N,N-dimethyl-1,3-DAP | 0.06% | Water | Acetic acid | 0.02% | — | — |
| Example 5 | DL-1-amino-2-propanol | 0.05% | Water | — | — | — | — |
| Example 6 | DL-1-amino-2-propanol | 0.09% | Water | Acetic acid | 0.02% | — | — |
| Example 7 | N-methyl-1,3-DAP | 0.05% | Water | TEAH | 0.04% | — | — |
| Example 8 | 1,4-diaminobutane | 0.05% | Water | TEAH | 0.02% | — | — |
| Example 9 | 3-amino-1-propanol | 0.10% | Water | — | — | — | — |
| Comparative Example 1 | — | — | Water | — | — | — | — |
| Comparative Example 2 | — | — | Water | — | — | — | — |
| Comparative Example 3 | — | — | Water | TEAH | 0.20% | — | — |
| Comparative Example 4 | — | — | Water | — | — | — | — |
| Comparative Example 5 | — | — | Water | TEAH | 0.05% | — | — |
| Comparative Example 6 | — | — | Water | TEAH | 0.08% | — | — |

| | Other components | | | Co elution amount [ppb] | Determination | | |
|---|---|---|---|---|---|---|---|
| | Component name | Concentration | pH | | Co corrosion | Co cleaning | Cu cleaning |
| Example 1 | — | — | 12.3 | 9 | A | A | B |
| Example 2 | — | — | 11.8 | 51 | A | A | B |
| Example 3 | — | — | 11.2 | 52 | A | A | B |
| Example 4 | — | — | 10.3 | 41 | A | A | B |
| Example 5 | — | — | 10.8 | 34 | A | A | B |
| Example 6 | — | — | 10.0 | 116 | A | A | B |
| Example 7 | — | — | 11.6 | 181 | A | A | B |
| Example 8 | — | — | 11.5 | 5 | A | A | B |
| Example 9 | — | — | 11.2 | 6 | A | A | B |

TABLE 1-continued

| | | | | | | | |
|---|---|---|---|---|---|---|---|
| Comparative Example 1 | — | — | 7.0 | 145 | A | B | B |
| Comparative Example 2 | 1,3-DAP | 0.01% | 10.5 | 238 | B | A | A |
| Comparative Example 3 | Histidine, Citric acid | 0.04% 0.01% | 11.4 | 2139 | B | A | A |
| Comparative Example 4 | Citric acid | 0.38% | 2.4 | 3371 | B | A | A |
| Comparative Example 5 | 1,2,4-Triazole | 0.05% | 10.2 | 6 | A | B | B |
| Comparative Example 6 | 3,5-Dimethyl pyrazole | 0.05% | 11.9 | 0 | A | B | B |

In the cleaning agent composition of Examples 1 to 9, Co corrosion and Co detergency were both A.

On the other hand, in Comparative Example 1, since only water was used, Co was not corroded, but the Co cleaning was B.

In spite of a fact that the concentration of a compound having a chelating effect, which was used in Comparative Examples 2 and 3 as an alkaline cleaning agent composition was equal to or less than the concentration of the component (A) contained in the cleaning agent composition of Examples 1 to 9, it can be seen that, in Comparative Examples 2 and 3, the Cu cleaning was A, and compounds (1,3-diaminopropane, histidine, and citric acid) used in Comparative Examples 2 and 3 have a stronger chelating effect than that of the component (A).

Also in Comparative Example 4, it can be seen that the Cu cleaning was A, and the citric acid used in Comparative Example 4 has a stronger chelating effect than that of the component (A).

Therefore, in Comparative Examples 2 to 4, the effect of the compound having the chelating effect was strong, and the concentration was in a degree at which the Co cleaning became A but the Co corrosion was B.

In addition, the compounds used in Comparative Examples 5 and 6 (1,2,4-triazole and 3,5-dimethylpyrazole) had weak chelating effect and were less likely to cause the Co corrosion. However, since these include an aromatic ring, it is easy to remain on a Co surface. Therefore, in Comparative Examples 5 and 6, the Co corrosion was A, but Co cleaning and Cu cleaning were B.

While the present invention has been described in detail and with reference to specific embodiments, it will be apparent to those skilled in the art that various changes and modifications can be made therein without departing from the spirit and scope of the present invention. This application is based on a Japanese Patent Application No. 2017-052098, filed on Mar. 17, 2017, the content of which is incorporated herein by reference.

INDUSTRIAL APPLICABILITY

The cleaning agent composition of the invention can efficiently perform the cleaning without causing corrosion on a surface of the semiconductor device substrate. Therefore, the present invention is exceedingly useful industrially as a technique of cleaning a contaminated semiconductor device substrates in a step of manufacturing the semiconductor device or a display device.

The invention claimed is:

1. A cleaning agent composition for a semiconductor device substrate including at least one of wiring and an electrode in which the wiring and the electrode contain cobalt or a cobalt alloy, the cleaning agent composition comprising the following components (A) and (B):
    component (A): at least one compound selected from the group consisting of compounds represented by Formula (1):

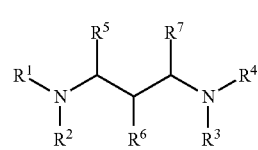

(1)

in Formula (1), $R^1$ represents an alkyl group having 1 to 4 carbon atoms; and $R^2$ to $R^7$ each independently represent a hydrogen atom, an alkyl group having 1 to 4 carbon atoms, a carboxyl group, a carbonyl group, or a functional group having an ester bond; and
    component (B): water.

2. The cleaning agent composition for a semiconductor device substrate according to claim 1,
    wherein a pH value is 9 to 14.

3. The cleaning agent composition for a semiconductor device substrate according to claim 1,
    wherein $R^1$ is a methyl group, $R^2$ is a methyl group or a hydrogen atom, and $R^3$ to $R^7$ each represent a hydrogen atom.

4. The cleaning agent composition for a semiconductor device substrate according to claim 1,
    wherein a content rate of the component (A) is 0.001% by mass to 0.5% by mass in 100% by mass of a total amount of the cleaning agent composition.

5. The cleaning agent composition for a semiconductor device substrate according to claim 1,
    wherein a cobalt elution amount is 200 ppb or less.

6. The cleaning agent composition for a semiconductor device substrate according to claim 1, further comprising: a pH adjuster as a component (C).

7. The cleaning agent composition for a semiconductor device substrate according to claim 6,
    wherein the component (C) contains a compound represented by Formula (p1), $$(R^{a1})_4 N^+ OH^-$$ (p1)

in Formula (p1), $R^{a1}$ represents a hydroxyl group, an alkoxy group, or an alkyl group which may be substituted with halogen, and four $R^{a1}$'s may be the same as or different from each other.

8. A cleaning agent composition for a semiconductor device substrate including at least one of wiring and an electrode in which the wiring and the electrode contain cobalt or a cobalt alloy, the cleaning agent composition comprising the following components (A), (B) and (D):

component (A): at least one compound selected from the group consisting of compounds represented by Formulas (1) to (4) below,

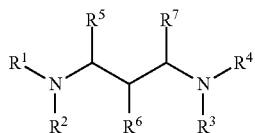

(1)

in Formula (1), $R^1$ represents an alkyl group having 1 to 4 carbon atoms and $R^2$ to $R^7$ each independently represent a hydrogen atom, an alkyl group having 1 to 4 carbon atoms, a carboxyl group, a carbonyl group, or a functional group having an ester bond,

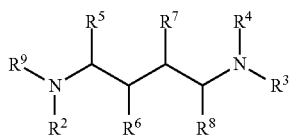

(2)

in Formula (2), $R^2$ to $R^9$ each independently represent a hydrogen atom, an alkyl group having 1 to 4 carbon atoms, a carboxyl group, a carbonyl group, or a functional group having an ester bond,

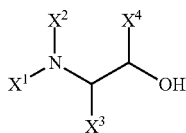

(3)

in Formula (3), $X^1$ to $X^4$ each independently represent a hydrogen atom, an alkyl group having 1 to 4 carbon atoms, a carboxyl group, a carbonyl group, or a functional group having an ester bond,

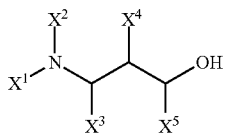

(4)

in Formula (4), $X^1$ to $X^5$ each independently represent a hydrogen atom, an alkyl group having 1 to 4 carbon atoms, a carboxyl group, a carbonyl group, or a functional group having an ester bond, component (B): water; and a reducing agent as a component (D).

9. The cleaning agent composition for a semiconductor device substrate according to claim 1, further comprising: a surfactant as a component (E).

10. The cleaning agent composition for a semiconductor device substrate according to claim 1,
wherein the semiconductor device substrate is a semiconductor device substrate after chemical mechanical polishing.

11. A method of cleaning a semiconductor device substrate, comprising:
cleaning a semiconductor device substrate including at least one of wiring and an electrode in which the wiring and the electrode contain cobalt or a cobalt alloy with the cleaning agent composition for a semiconductor device substrate according to claim 1.

12. A method of manufacturing a semiconductor device substrate, comprising:
cleaning a semiconductor device substrate including at least one of wiring and an electrode in which the wiring and the electrode contain cobalt or a cobalt alloy with the cleaning agent composition for a semiconductor device substrate according to claim 1.

13. A method of manufacturing a semiconductor device substrate, comprising cleaning a semiconductor device substrate with the cleaning agent composition for a semiconductor device substrate according to claim 1.

14. The cleaning agent composition for a semiconductor device substrate according to claim 8, wherein component (A) is Formula (2), and
wherein in Formula (2), $R^2$ to $R^9$ each represent a hydrogen atom.

15. The cleaning agent composition for a semiconductor device substrate according to claim 8, wherein component (A) is Formula (3), and
wherein in Formula (3), $X^1$ to $X^4$ each independently represent a hydrogen atom or an alkyl group having 1 to 4 carbon atoms.

16. The cleaning agent composition for a semiconductor device substrate according to claim 8, wherein component (A) is Formula (3), and
wherein in Formula (3), $X^1$ to $X^3$ each represent a hydrogen atom, and $X^4$ is a methyl group.

17. The cleaning agent composition for a semiconductor device substrate according to claim 8, wherein component (A) is Formula (4), and
wherein in Formula (4), $X^1$ to $X^5$ each represent a hydrogen atom.

* * * * *